US008488490B2

(12) United States Patent
Klincewicz et al.

(10) Patent No.: US 8,488,490 B2
(45) Date of Patent: Jul. 16, 2013

(54) METHODS AND APPARATUS TO DETERMINE A CAPACITY FOR A NETWORK LAYER TOPOLOGY

(75) Inventors: John Klincewicz, Wayside, NJ (US); Gagan Choudhury, Marlboro, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 945 days.

(21) Appl. No.: 12/579,165

(22) Filed: Oct. 14, 2009

(65) Prior Publication Data
US 2011/0085469 A1   Apr. 14, 2011

(51) Int. Cl.
*H04L 12/28* (2006.01)
(52) U.S. Cl.
USPC .......................................... 370/254; 370/255
(58) Field of Classification Search
None
See application file for complete search history.

(56) References Cited

U.S. PATENT DOCUMENTS

| 5,067,127 | A | * | 11/1991 | Ochiai ........................... 370/238 |
| 5,627,889 | A | * | 5/1997 | Eslambolchi ............ 379/221.03 |
| 6,141,318 | A | * | 10/2000 | Miyao ........................... 370/217 |
| 6,151,305 | A | * | 11/2000 | Chen ............................ 370/238 |
| 6,219,337 | B1 | * | 4/2001 | Miyao ........................... 370/230 |
| 6,449,279 | B1 | * | 9/2002 | Belser et al. .................. 370/397 |
| 6,490,451 | B1 | * | 12/2002 | Denman et al. ............... 455/436 |
| 6,611,874 | B1 | * | 8/2003 | Denecheau et al. .......... 709/239 |
| 6,658,479 | B1 | * | 12/2003 | Zaumen et al. ............... 709/238 |
| 6,934,259 | B2 | * | 8/2005 | Klincewicz et al. .......... 370/238 |
| 7,111,074 | B2 | * | 9/2006 | Basturk ......................... 709/241 |
| 7,177,927 | B1 | * | 2/2007 | Cahn ............................. 709/224 |
| 7,643,408 | B2 | * | 1/2010 | Atkinson et al. ............... 370/217 |
| 7,675,868 | B2 | * | 3/2010 | Balonado et al. ............. 370/254 |
| 7,903,563 | B2 | * | 3/2011 | Schollmeier et al. ......... 370/238 |
| 7,903,564 | B2 | * | 3/2011 | Ramakrishnan et al. ..... 370/238 |
| 7,969,862 | B1 | * | 6/2011 | Wang et al. ................... 370/216 |
| 8,098,679 | B2 | * | 1/2012 | Andrade et al. ............... 370/437 |
| 2002/0120745 | A1 | * | 8/2002 | Oishi et al. .................... 709/226 |
| 2002/0141343 | A1 | * | 10/2002 | Bays ............................. 370/235 |
| 2003/0084367 | A1 | * | 5/2003 | Suemura .......................... 714/4 |
| 2003/0142682 | A1 | * | 7/2003 | Bressoud et al. ............. 370/401 |

(Continued)

OTHER PUBLICATIONS

Chiu et al., "Network Design and Architectures for Highly Dynamic Next-Generation IP-Over-Optical Long Distance Networks," Journal of Lightwave Technology, vol. 27, Issue 12, Jun. 15, 2009, 14 pages.

(Continued)

*Primary Examiner* — Bunjob Jaroenchonwanit
(74) *Attorney, Agent, or Firm* — Hanley, Flight & Zimmerman, LLC

(57) ABSTRACT

Methods and apparatus to determine a capacity for a network topology are disclosed herein. An example method is described, which includes receiving a network layer topology comprising a plurality of network layer links, applying weights to the network layer links, selecting one of a plurality of traffic elements, the selected traffic element comprising endpoint nodes and a traffic demand, determining, for one or more of the network layer links, whether the selected traffic element may be routed on the network layer link without adding capacity to the network layer link, applying penalties to the weights associated with the network layer links that cannot support the selected traffic element without adding capacity, determining, based on the weights and penalties of the network layer links, a routing path including one or more of the network layer links between the endpoint nodes, adding the selected traffic element to the network layer links on the routing path, and determining the capacity of the network layer links based on the selected traffic element.

20 Claims, 11 Drawing Sheets

U.S. PATENT DOCUMENTS

| | | | |
|---|---|---|---|
| 2003/0147352 A1* | 8/2003 | Ishibashi et al. | 370/248 |
| 2003/0158964 A1* | 8/2003 | Kobayashi | 709/238 |
| 2004/0168088 A1* | 8/2004 | Guo et al. | 713/201 |
| 2004/0205237 A1* | 10/2004 | Doshi et al. | 709/241 |
| 2005/0083949 A1* | 4/2005 | Dobbins et al. | 370/395.53 |
| 2006/0077907 A1* | 4/2006 | Rabinovitch et al. | 370/254 |
| 2006/0250964 A1 | 11/2006 | Vasseur et al. | |
| 2007/0002734 A1* | 1/2007 | Kim et al. | 370/229 |
| 2007/0019624 A1* | 1/2007 | Munson et al. | 370/352 |
| 2007/0064613 A1* | 3/2007 | Qian et al. | 370/238 |
| 2007/0070883 A1* | 3/2007 | Lysne et al. | 370/218 |
| 2007/0230346 A1* | 10/2007 | Yamada et al. | 370/235 |
| 2008/0151755 A1* | 6/2008 | Nishioka | 370/235 |
| 2009/0245138 A1* | 10/2009 | Sapsford et al. | 370/254 |
| 2010/0182936 A1* | 7/2010 | Valdevit et al. | 370/254 |
| 2011/0085445 A1* | 4/2011 | Klincewicz et al. | 370/238 |
| 2011/0085469 A1* | 4/2011 | Klincewicz et al. | 370/254 |
| 2011/0255443 A1* | 10/2011 | Ashwood-Smith et al. | 370/254 |
| 2012/0063323 A1* | 3/2012 | Mortier et al. | 370/241 |
| 2012/0102228 A1* | 4/2012 | Cugini et al. | 709/242 |

OTHER PUBLICATIONS

Klincewicz et al., "Incorporating QoS into IP Enterprise Network Design," Telecommunications Systems, 2002, pp. 81-106, Kluwer Academic Publishers, the Netherlands.

Holmberg et al., "Optimization of Internet Protocol Network Design and Routing," Wiley Periodicals, Inc., vol. 43, 2004, pp. 39-53.

Borne et al., "Design of Survivable IP-over-optical networks," Springer Science and Business Media, LLC, published online Jun. 27, 2006, pp. 41-73.

Buriol et al., "Survivable IP Network Design with OSPF Routing," Wiley Periodicals, Inc., published online Oct. 2, 2006 at www.interscience.wiley.com, vol. 49, pp. 51-64, 2007.

Andrade et al., "Survivable Composite-Link IP Network Design with OSPF Routing," AT&T Labs Research Technical Report, Jan. 5, 2006, 4 pages.

Bley et al., "Design of Broadband Virtual Private Networks: Model and Heuristics for the B-WiN," Konrad-Zuse-Zentrum, Mar. 30, 1998, 16 pages.

Chiu et al., "Network Design and Architectures for Highly Dynamic Next-Generation IP-over-Optical Long Distance Networks," Presented Mar. 22-29, 2009, Proceedings of OFC/NFOEC, San Diego, CA, 3 pages.

Klincewicz, "Issues in link topology design for IP networks," SPIE vol. 6011, Oct. 24-25, 2005, 10 pages.

Choudhury, "Models for IP/MPLS Routing Performance: Convergance, Fast Reroute, and QoS Impact," Keynote Address, Proceedings of ITCOM Conference on Performance, QoS and Control of Next-Generation Communication Networks, SPIE vol. 5598, Philadelphia, PA, pp. 1-12, Oct. 26-27, 2004.

* cited by examiner

302 → TOPOLOGY DATABASE

| LINK | NODE 1 | NODE 2 | LENGTH (km) |
|---|---|---|---|
| A | N1 | N2 | 861 |
| B | N2 | N3 | 230 |
| C | N1 | N3 | 1090 |
| D | N1 | N5 | 558 |
| E | N5 | N6 | 575 |
| F | N6 | N7 | 1613 |
| G | N3 | N4 | 2757 |
| H | N4 | N7 | 1091 |
| I | N3 | N8 | 2781 |
| J | N8 | N9 | 1073 |
| K | N9 | N10 | 126 |
| L | N7 | N10 | 2290 |
| M | N10 | N11 | 1189 |
| N | N7 | N11 | 1146 |

FIG. 5

304 → TRAFFIC MATRIX

DESTINATION NODE

| | N1 | N2 | N3 | N4 | N5 | N6 | N7 | N8 | N9 | N10 | N11 |
|---|---|---|---|---|---|---|---|---|---|---|---|
| N1 | | 8.98 | 12.16 | 4.42 | 17.64 | 11.21 | 15.86 | 10.16 | 24.44 | 8.23 | 8.75 |
| N2 | 17.15 | | 18 | 23.91 | 24.34 | 2.08 | 12.63 | 6.65 | 18.09 | 20.13 | 15.07 |
| N3 | 4.83 | 19.11 | | 5.22 | 19.4 | 12.13 | 16 | 5.19 | 12.8 | 15.64 | 7.56 |
| N4 | 16.37 | 6.28 | 13.23 | | 6.73 | 6.12 | 7.8 | 15.58 | 20.59 | 17.36 | 22.84 |
| N5 | 2.46 | 10.58 | 10.27 | 6.75 | | 6.77 | 4.56 | 16.26 | 7.04 | 23.46 | 4.52 |
| N6 | 14.15 | 16.77 | 9.04 | 24.62 | 16.54 | | 2.66 | 16.38 | 24.7 | 18.83 | 9.34 |
| N7 | 24.85 | 5.56 | 10.32 | 4.08 | 10.93 | 18.65 | | 4.11 | 7.75 | 9.65 | 24.57 |
| N8 | 12.85 | 5.07 | 20.58 | 23.56 | 14.21 | 21.74 | 17.57 | | 23.85 | 5.47 | 2.74 |
| N9 | 18.44 | 18.29 | 14.3 | 14.86 | 19.69 | 5.83 | 24.24 | 3.35 | | 6.85 | 13.83 |
| N10 | 5.15 | 19.07 | 23.92 | 16.57 | 15.78 | 13.5 | 4.97 | 12.57 | 6.37 | | 15.97 |
| N11 | 3.96 | 7.06 | 8.86 | 18.65 | 4.08 | 20.32 | 11.27 | 7.83 | 8.03 | 13.63 | |

SOURCE NODE

FIG. 6

306 → IP LINKS

| IP LINK | LENGTH (km) | WEIGHT | $T_i$ (Gbps) | $c_i$ (Gbps) | UTILIZATION |
|---|---|---|---|---|---|
| A | 861 | 3.24 | 0 | 40 | 0 |
| B | 230 | 1.60 | 0 | 40 | 0 |
| C | 1090 | 3.83 | 0 | 40 | 0 |
| D | 558 | 2.45 | 0 | 40 | 0 |
| E | 575 | 2.49 | 0 | 40 | 0 |
| F | 1613 | 5.19 | 0 | 40 | 0 |
| G | 2757 | 8.16 | 0 | 40 | 0 |
| H | 1091 | 3.83 | 0 | 40 | 0 |
| I | 2781 | 8.22 | 0 | 40 | 0 |
| J | 1073 | 3.79 | 0 | 40 | 0 |
| K | 126 | 1.33 | 0 | 40 | 0 |
| L | 2290 | 6.95 | 0 | 40 | 0 |
| M | 1189 | 4.09 | 0 | 40 | 0 |
| N | 1146 | 3.98 | 0 | 40 | 0 |
| EXPRESS1 | 2223 | 6.77 | 0 | 40 | 0 |
| EXPRESS2 | 3980 | 11.34 | 0 | 40 | 0 |
| EXPRESS3 | 3836 | 10.96 | 0 | 40 | 0 |

306 → IP LINKS

| IP LINK | LENGTH (km) | WEIGHT | $T_i$ (Gbps) | $c_i$ (Gbps) | $T_i$ + 23.91 (Gbps) | NEW UTILIZATION | WEIGHT + PENALTY |
|---|---|---|---|---|---|---|---|
| A | 861 | 3.24 | 50.24 | 80 | 74.15 | 0.926875 | 3.24 |
| B | 230 | 1.60 | 20.84 | 40 | 44.75 | 1.11875 | 2.60 |
| C | 1090 | 3.83 | 15.72 | 40 | 39.63 | 0.99075 | 9.83 |
| D | 558 | 2.45 | 6.95 | 40 | 30.86 | 0.7715 | 2.45 |
| E | 575 | 2.49 | 23.98 | 40 | 47.89 | 1.19725 | 5.49 |
| F | 1613 | 5.19 | 26.88 | 40 | 50.79 | 1.26975 | 12.19 |
| G | 2757 | 8.16 | 9.18 | 40 | 33.09 | 0.82725 | 8.16 |
| H | 1091 | 3.83 | 12.36 | 40 | 36.27 | 0.90675 | 3.83 |
| I | 2781 | 8.22 | 14.14 | 40 | 38.05 | 0.95125 | 23.22 |
| J | 1073 | 3.79 | 32.17 | 40 | 56.08 | 1.402 | 10.79 |
| K | 126 | 1.33 | 27.5 | 40 | 51.41 | 1.28525 | 2.33 |
| L | 2290 | 6.95 | 21.49 | 40 | 45.4 | 1.135 | 10.95 |
| M | 1189 | 4.09 | 25.55 | 40 | 49.46 | 1.2365 | 8.09 |
| N | 1146 | 3.98 | 19.84 | 40 | 43.75 | 1.09375 | 9.98 |
| EXPRESS1 | 2223 | 6.77 | 67.98 | 80 | 91.89 | 1.148625 | 16.77 |
| EXPRESS2 | 3980 | 11.34 | 42.31 | 80 | 66.22 | 0.82775 | 11.34 |
| EXPRESS3 | 3836 | 10.96 | 30.13 | 40 | 54.04 | 1.351 | 18.96 |

METHODS AND APPARATUS TO DETERMINE A CAPACITY FOR A NETWORK LAYER TOPOLOGY

FIELD OF THE DISCLOSURE

This disclosure is generally related to designing Internet protocol (IP) link topology over physical links and, more particularly, to methods and apparatus to determine a capacity for a network layer topology.

BACKGROUND

The Open System Interconnection (OSI) reference model uses seven different layers to define system interconnections. The first layer of the OSI model is the physical layer, which defines the basic hardware functions through which two systems can physically communicate raw bits of information. The physical layer includes hardware to transmit electromagnetic signals including, for example, electrical, wireless, and optical signals.

The third layer of the OSI model is the network layer, which is responsible for connection functions, addressing, and routing of information from a source to a destination. The third layer of the OSI model operates using the physical interconnections defined at the physical layer. In a system where the network layer is an Internet Protocol (IP) network layer, a network is defined by a plurality of interconnected nodes or routers that each have an IP address. Packets of data are then transmitted over router-to-router links between different source-destination pairs. Not every pair of nodes or routers is directly connected and some source-destination pairs must send packets over a series of direct node-to-node or router-router connections to exchange traffic.

In an IP-over-wavelength division multiplexing (WDM) architecture, the communication links or IP links (network layer) between router pairs are established using wavelengths carried over optical fibers (physical layer). Using WDM, each optical fiber in the optical network can carry multiple wavelengths and, thus, multiple IP links. In particular, a given physical link in the optical network may carry wavelengths that connect multiple different router pairs.

BRIEF DESCRIPTION OF THE DRAWINGS

FIG. 5 illustrates an example topology database representative of the example optical network of FIG. 4.

FIG. 6 illustrates an example traffic database representative of example communication traffic handled by the example optical network of FIG. 4.

DETAILED DESCRIPTION

Certain examples are shown in the above-identified figures and described in detail below. In describing these examples, like or identical reference numbers may be used to identify similar elements. The figures are not necessarily to scale and certain features and certain views of the figures may be shown exaggerated in scale or in schematic for clarity and/or conciseness. Although the following discloses example methods, apparatus, and articles of manufacture, it should be noted that such methods, apparatus, and articles of manufacture are merely illustrative and should not be considered as limiting. Accordingly, while the following describes example methods, apparatus, and articles of manufacture, the examples are not the only way to implement such methods, apparatus, and articles of manufacture.

The example methods and apparatus described herein are useful in determining, given an IP network with a specified set of routers (nodes), a specified set of IP links that interconnect them, and a specified traffic matrix, the IP link capacity that should be installed on each of the IP links to implement an IP link topology using Optimized Multiprotocol Label Switching/Traffic Engineering (MPLS/TE) to route traffic. In some examples, the IP network further includes sufficient survivability to support a number of failure scenarios. For example, the IP network may be required to survive the loss of any node in the IP network by rerouting the traffic traveling through that node via another path. In some other examples, the IP network may be required to survive the loss of two or three nodes in the IP network.

In some examples, capacity is installed in modular units. For example, on a national backbone network, capacity is added in increments of 40 gigabit per second (Gbps) wavelengths. Each additional unit of capacity on an IP link can be very costly and, thus, reducing the necessary capacity reduces the cost of implementing the IP network.

In contrast to previous capacity planning systems, the example methods and apparatus described below determine a sufficient amount of IP link capacity for a variety of network failure conditions when traffic engineering is to be used in the network. Based on the determined paths, capacity is added in a low-cost manner. Previous systems, such as systems using Open Shortest Path First, test possible network scenarios and then set the capacity of each network layer link to support the highest amount of traffic seen on that network layer link during any network scenario. While such an OSPF system will ensure survivability of the network during the tested conditions, the example systems described herein allow for less spare capacity to be used in the network and, thus, less cost to implement the network while still ensuring equal or better survivability of the network.

Figure 1:
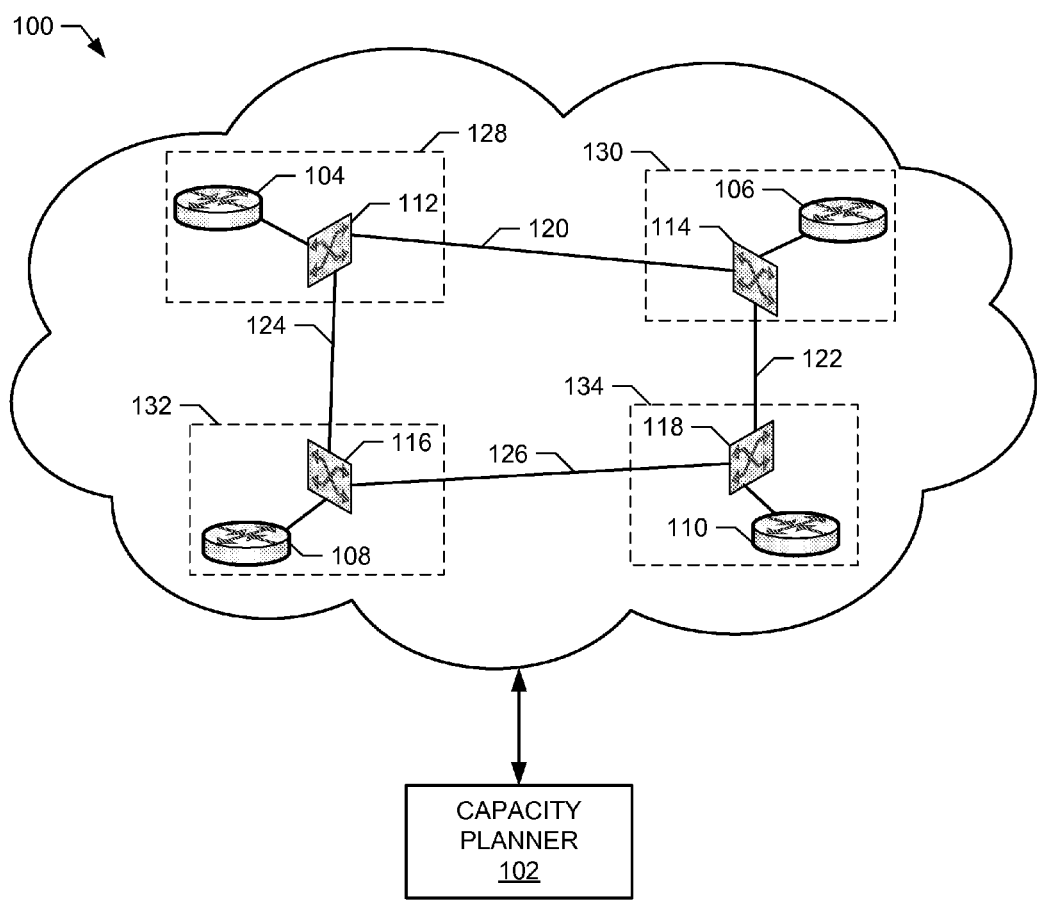
FIG. 1 illustrates an example communications network and an example capacity planner.

FIG. 1 illustrates an example communications network 100 and an example capacity planner 102. The communications network 100 may represent, for example, a simple IP-over-WDM network. The network 100 includes four routers 104, 106, 108, and 110. Each of the routers 104-110 is connected to a respective optical switch 112, 114, 116, and 118. The optical switches 112-118 are interconnected via physical links 120, 122, 124, and 126, each link representing one or more optical fibers. Each optical fiber on a link can carry one or more wavelengths between a pair of optical switches 112-118. Together, a router and an optical switch may be represented by a node, as shown at reference numerals 128, 130, 132, and 134.

In an optical network, a wavelength represents a frequency of laser light that can be used to transmit a digital signal, such as an OC48, OC192 or OC768. A single digital connection between a pair of routers corresponds to a pair of wavelengths that carry traffic in opposite directions. A single digital connection will be referred to herein as a circuit. A set of wavelengths between the same pair of routers constitutes an IP-layer link, or, simply, an IP link. An individual IP link may consist of one or more circuits between the same pair of routers 104-110. The number of circuits on an IP link determines the capacity (e.g., in megabits per second (Mbps), Gbps, or terabits per second (Tbps)) of the link. The capacity that is required on an IP link is determined not only by the amount of traffic that needs to be carried under normal conditions, but by the amount of traffic that would have to use that IP link because of a failure elsewhere in the network 100.

Each physical link can carry multiple IP links, e.g. link 120 can carry both circuits between the routers 104 and 106 and circuits between the routers 104 and 110. Each physical link 120-126 has a length, which is used in the described examples to calculate the shortest physical paths over an optical network.

A set of physical links that all carry the same set of circuits is often referred to as a Shared Risk Link Group (SRLG). A failure anywhere in the SRLG will cause the same set of router-to-router connections to be lost. An SRLG may include a single physical link or multiple physical links.

The circuits between pairs of routers 104-110 utilize the physical links 120-126. For example, the router 104 and the router 106 are connected by signals that are carried over the physical link 120. The IP links can also utilize multiple physical links 120-126. For example, the router 104 and the router 110 can be connected by signals that are carried via the physical link 120 and the physical link 122, and/or via the physical link 124 and the physical link 126. Similarly, the routers 106 and 108 can be connected by signals carried on the physical links 120 and 124 and/or the physical links 122 and 126. IP links that utilize multiple physical links are referred to herein as express links.

Figure 2:
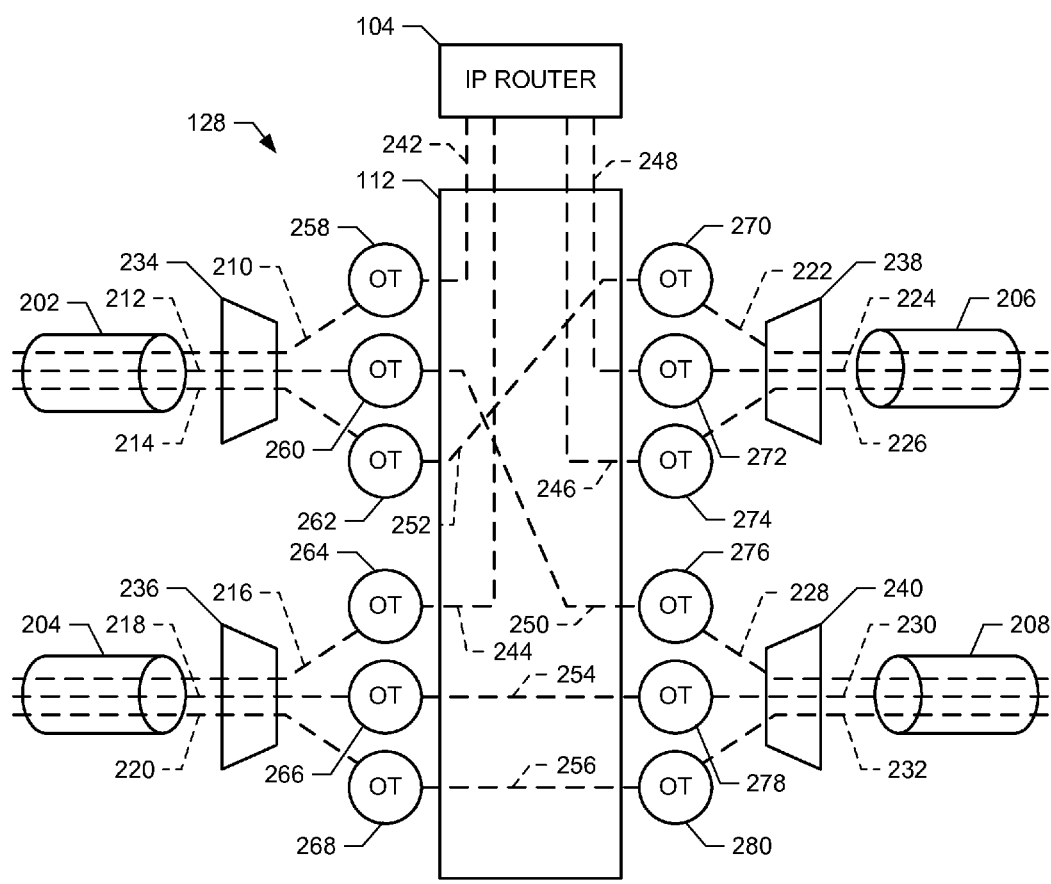
FIG. 2 is a more detailed block diagram of an example node illustrated in FIG. 1.

FIG. 2 is a more detailed block diagram of an example node 128 illustrated in FIG. 1. For clarity and brevity, the following discussion will refer to the example node 128, which includes the example router 104 and the example optical switch 112 of FIG. 1. The example node 128 connects to other nodes (e.g., the nodes 130 and 132 of FIG. 1) via optical fibers 202, 204, 206, and 208. Each example fiber carries multiple wavelengths 210-232, which are represented by dashed lines. Wavelengths 210-232 carried on the same fibers 202-208 (e.g., 210 and 212) have different optical wavelengths, but wavelengths 210-232 carried on different fibers 202-208 (e.g., 210 and 216) may have similar or identical optical wavelengths. Within the optical fibers 202-208 the different wavelengths are combined into an optical signal.

Dense wavelength division multiplexers (DWDM) 234, 236, 238, and 240 separate the optical signals carried by the fibers 202-208 into the individual wavelengths 210-232, which are then converted into common frequencies 242-256 by optical transponders (OTs) 258-280. The common frequencies can then be cross-connected by the optical switch 112. That is, different "incoming" wavelengths (e.g., 210-214 and 222-226) can either be routed onto "outgoing" wavelengths (e.g., 216-220 and 228-232) or terminated on the IP router 104. In order to be transmitted on an outgoing wavelength, the common frequencies once again pass through OTs 258-280 and DWDMs 234-240.

Figure 3:
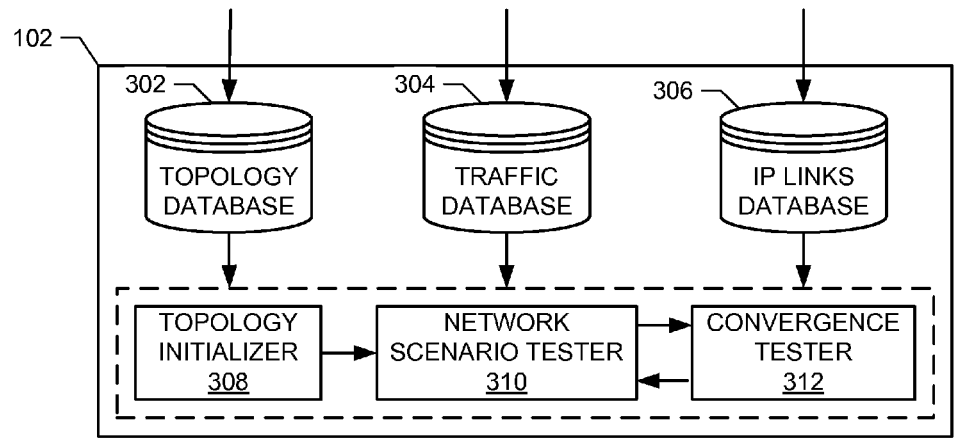
FIG. 3 is a more detailed block diagram of the example capacity planner illustrated in FIG. 1.

FIG. 3 is a more detailed block diagram of the example capacity planner 102 illustrated in FIG. 1. The capacity planner 102 may be used to determine a required capacity for an IP network given the set of routers or nodes in the IP network, a specified set of IP links that interconnect the nodes, and a specified traffic matrix that includes the traffic exchanged between the nodes via the IP links. The example capacity planner 102 will be described with reference to FIG. 4, which illustrates a schematic view of an example optical network 400 including example nodes N1-N11 connected via physical links A-N. Given the optical network 400 illustrated in FIG. 4, the capacity planner 102 determine the capacity necessary to ensure a desired degree of survivability in the optical network 400.

The example capacity planner 102 of FIG. 3 includes a topology database 302, a traffic database 304, and an IP links database 306. To determine the capacity for an IP network based on the topology database 302, the traffic database 304, and the IP links database 306, the capacity planner 102 further includes a topology initializer 308, a network scenario tester 310, and a convergence tester 312.

The topology database 302 is populated with pairs of nodes (e.g., N1 and N2, N1 and N5, etc.) that are each connected via a single physical link (e.g., A, D, etc.). The topology database 302 may be populated via user input of the physical topology of the optical network 400. Alternatively, the data may be gathered from other databases in which topology information is stored. In addition to identifying the nodes of a node pair, the topology database 302 further includes the length of the node pair. An example topology database 302 representative of the example optical network 400 is illustrated in FIG. 5. In some examples, the topology database 302 includes distances and the shortest physical path between each set of nodes N1-N11.

The traffic database 304 is a matrix of traffic elements (e.g., node-to-node traffic) that the network 400 is required to serve. Each traffic element includes a source node, a destination node, and a traffic demand. Like the topology database 302, the traffic database 304 is populated by user input. However, the data may additionally or alternatively be gathered from other databases in which traffic information is stored. IP traffic occurs in two directions (e.g., from N1 to N2 and from N2 to N1), and spans multiple nodes N1-N11 for traffic between nodes N1-N11, including those nodes N1-N11 that are not necessarily directly connected via a physical link A-N. An example traffic database 304, as illustrated in FIG. 6, is organized by the source node, the destination node, and the amount of traffic is in gigabits per second. The IP links database 306 includes a set of IP links that are provided by, for example, a user of the capacity planner 102. The IP links included in the IP links database 306 are considered and included in the example network topology generated by the capacity planner 102 as described in more detail below.

The topology initializer 308 initializes several variables in preparation for evaluating the IP link topology. The topology initializer 308 initializes tentative capacities $c_i$ for each IP link i to be equal to a minimum capacity. As referred to herein, the capacity of an IP link is derived from one or more dedicated wavelengths or dedicated bandwidth between the endpoint nodes of the IP link via one or more physical links. Thus, the minimum capacity of the example IP links may be one 40 Gbps wavelength. The topology initializer 308 further initializes a previous capacity $c^p_i$ of each IP link i to be equal to the tentative capacity $c_i$ of the respective IP link. Thus, the previous capacity $c^p_i$ for each IP link may also be initialized to be one 40 Gbps wavelength.

The topology initializer 308 further assigns weights $w_i$ to each of the IP links i. The weight $w_i$ assigned to an IP link may be based on a formula determined by a network design user. For example, the weight $w_i$ of an IP link i may assign a weight to each kilometer of physical fiber (e.g., 1/km) along the path of the IP link i in addition to a constant weight (e.g., 300) representative of the IP port cost at the endpoint nodes of the IP link i. The weights are generally unitless, but may alternatively have a unit attached to them. The topology initializer 308 may further list the elements of the traffic database 304 in some deterministic or random order.

After the topology initializer 308 initializes the IP link topology variables, the network scenario tester 310 tests the IP link topology according to one or more network scenarios. The tested network scenarios may include, but are not limited to, normal network conditions (e.g., all physical links are operational), single failure conditions (e.g., one physical link and/or node has failed), single/double failure conditions (e.g., two physical links and/or nodes have failed), and/or single/double/triple failure conditions (e.g., three physical links and/or nodes have failed). The examples described below and illustrated in the drawings will refer to normal network conditions and single failure conditions but may be extended to single/double and/or single/double/triple failure scenarios in a straightforward manner.

The network scenario tester 310 tests all desired network scenarios and outputs final capacities $c^f_i$ for each IP link i corresponding to the IP link topology. The final capacities $c^f_i$ are the upper capacities needed on each IP link i to provide survivability under each possible failure scenario tested. In some examples, the network scenario tester 310 retests the network scenarios at least once using capacities determined during a previous test as initial capacities. The network scenario tester 310 is described in more detail below with reference to FIG. 8.

The convergence tester 312 then determines whether the IP link capacities $c_i$ have substantially changed from the previous capacities $c^p_i$. If any of the IP link capacities $c_i$ substantially change (i.e., have not converged), the convergence tester 312 sets the previous IP link capacities $c^p_i$ to be equal to the most recent IP link capacities $c_i$ and cause the network scenario tester 310 to retest again. The convergence tester 312 and the network scenario tester 310 may repeat the network scenario tests and convergence tests multiple times until the IP link capacities $c_i$ are substantially the same from one test to a subsequent test (i.e., the IP link capacities $c_i$ have converged).

The example capacity planner 102 simulates the routing of traffic in the traffic database 304 under normal conditions (i.e., no network failures) and under different possible failure conditions. As a result, the capacity planner 102 determines the upper amount of traffic $T_i$ that each IP link would be required to carry. For example, if the physical link E fails, the remainder of the physical links A-D and F-N must carry additional IP links and additional traffic, which requires a certain amount of additional capacity on each of the other physical links A-D and F-N. The capacity planner 102 determines the amount of capacity on each physical link A-N that is necessary to accommodate all failure conditions.

Additional capacity over a physical link has an associated cost. The cost is typically related to fiber length and terminating equipment. The costs related to fiber length include any capital or operational costs that are proportional to distance. For example, the longer a physical link is, the more fiber will be required to add a given amount of capacity. Costs related to terminating equipment include all costs that are independent of the distance between the endpoint nodes, such as the ports on the router. After the capacity planner 102 determines the required capacity for each of the different topologies, the capacity planner 102 determines the cost associated with each topology.

Figures 7, 8:
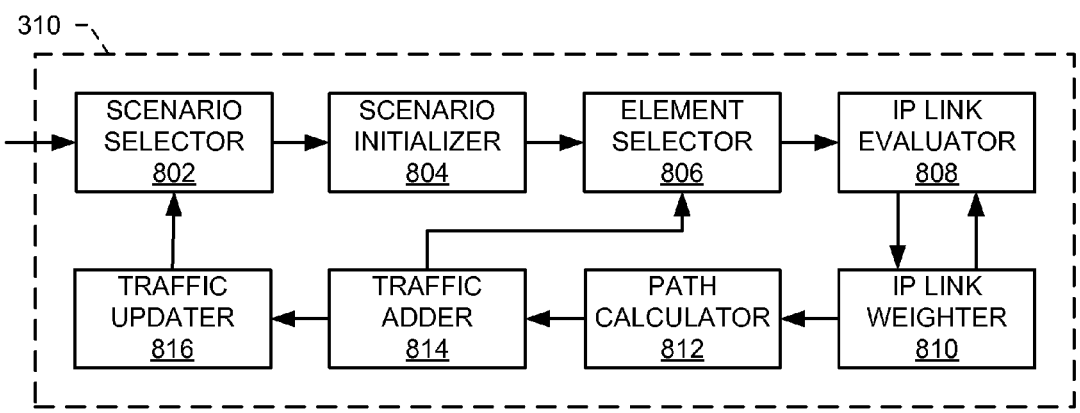
FIG. 7 is a table of example IP links in the IP links database of FIGS. 1 and 3 after being initialized by the topology initializer of FIG. 3.
FIG. 8 is a more detailed block diagram of an example network scenario tester of FIG. 3.
Figure 15:
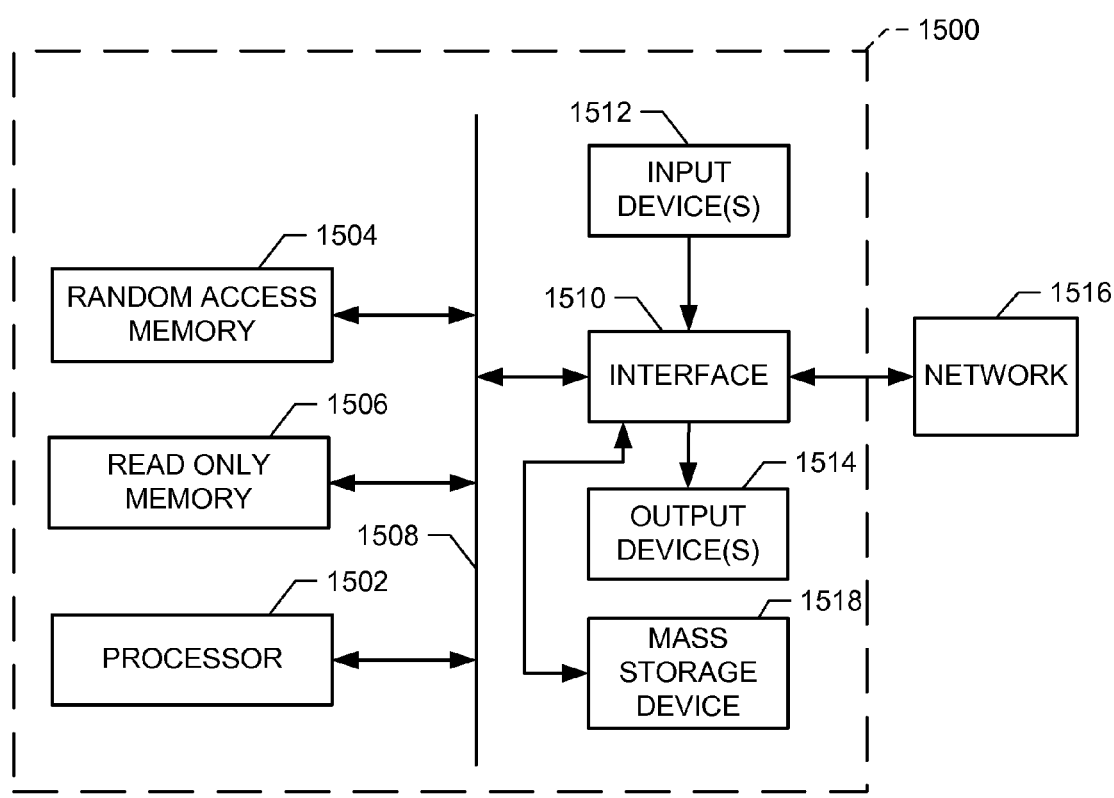
FIG. 15 is a block diagram of an example processing system that may execute the example machine readable instructions described herein.

FIG. 7 is a table 700 of the example IP links determined by the network designer 102 of FIGS. 1 and 3 after being initialized by the topology initializer 308 of FIG. 15. In the examples of FIGS. 7, 9, 10, and 11, the IP links A-N will represent IP links having a path over the physical link of the same name. Thus, the IP link A is routed between nodes N1 and N2 via the physical link A. The IP links have corresponding weights as calculated by the topology initializer 308. The example weights $w_i$ are determined by the formula $w_i=$(IP link distance in km)/385+1. Thus, the weights $w_i$ include a distance-based factor and a fixed factor, where the fixed factor is equivalent to 385 km of distance. The example table further includes the upper traffic $T_i$, the tentative capacity $c_i$, and the utilization of each IP link. The utilization of an IP link is the upper traffic $T_i$ as a percentage of the tentative capacity $c_i$. The initial capacities of the IP links are equal to one 40 Gbps wavelength in each direction between the endpoint nodes of the respective IP links. While the traffic on the IP links is directional, the upper traffic $T_i$ of an IP link i reflects the larger upper traffic of the two directions on the IP link i.

FIG. 8 is a more detailed block diagram of the example network scenario tester 310 of FIG. 3 using Optimized MPLS/TE for routing traffic. As mentioned above, the network scenario tester 310 tests network scenarios and outputs tentative $c_i$ and final $c^f_i$ capacities for each IP link i corresponding to the IP link topology under test. The example network scenario tester 310 includes a scenario selector 802, a scenario initializer 804, an element selector 806, an IP link evaluator 808, an IP link weighter 810, a path calculator 812, a traffic adder 814, and a traffic updater 816. The network scenario tester 310 is invoked after the topology initializer 308 initializes the tentative capacities $c_i$ for the IP link topology, outputs the final IP link capacities $c^f_i$ for the IP link topology based on all network scenarios, and may be repeatedly invoked by the convergence tester 312 based on the capacities output by the network scenario tester 310.

Figures 9, 10:
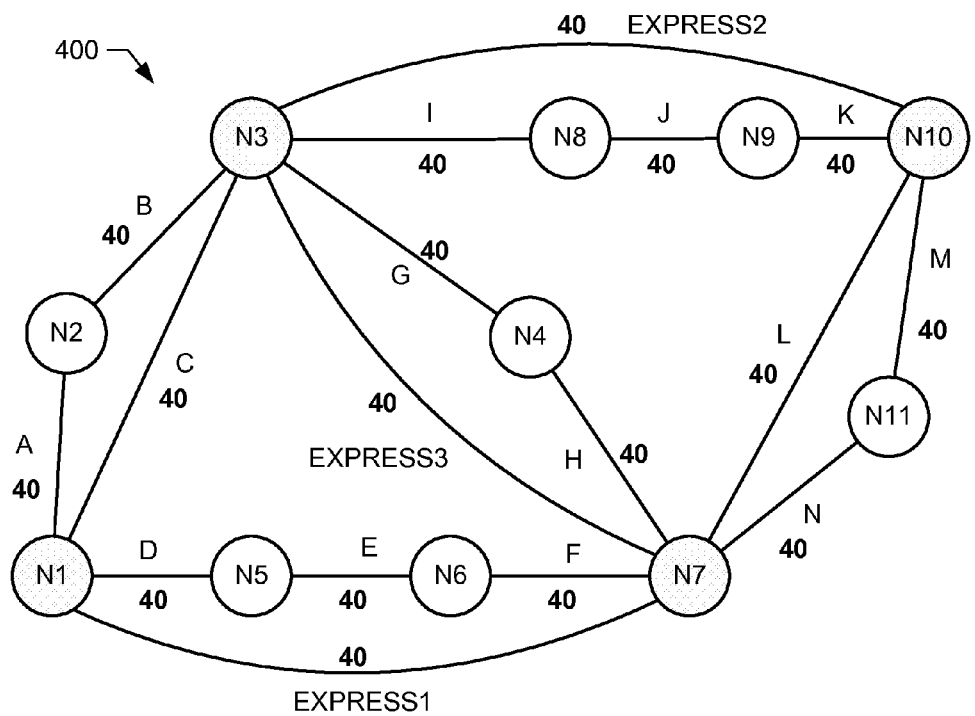
FIG. 9 illustrates the example optical network of FIG. 4 in accordance with the corresponding initialized capacities of FIG. 7 in units of gigabits per second.
FIG. 10 is the table of FIG. 9 after several traffic elements from a traffic database have been added to the IP links in a selected network scenario.

When the network scenario tester 310 is invoked, the scenario selector 802 selects a first network scenario for testing or consideration. The scenario initializer 804 initializes the maximum traffic $T_i$ for each IP link i encountered over all network scenarios to be zero and initializes the traffic $t_i$ on each IP link i for the first network scenario to be zero. FIG. 9 illustrates the IP links database 306 of FIG. 7 associated with the example optical network 400 of FIG. 4 and the corresponding initialized capacities in Gbps.

After initializing the scenario, the element selector 806 selects a traffic element from the traffic database 306, which is ordered by the topology initializer 308. The IP link evaluator 808 evaluates each IP link i and determines, given the capacity of the IP link $c_i$ and the traffic on the IP link $t_i$, whether the IP link i can support the traffic demand on the traffic element. If the IP link i has enough remaining capacity to support the traffic, the IP link weighter 810 does not change the weight $w_i$ of the IP link i. However, if the IP link i would need additional capacity to handle the traffic, the IP link weighter 810 adds a penalty to the weight $w_i$ of the IP link i. The tentative capacities $c_i$ used by the network scenario tester 310 of FIG. 8 may be an initial capacity as described above. Alternatively, the tentative capacities $c_i$ may be previously generated by the network scenario tester 310 during a previous test.

The IP link weighter 810 may add an additive or multiplicative penalty to the weight $w_i$ when there is not enough tentative capacity $c_i$ to support the traffic demand in addition to the traffic $t_i$. An example additive weight would be representative of the cost to route or reroute traffic over the IP link i, such as a wavelength-distance penalty and a fixed penalty. The penalties may be automatically determined via a penalty function and/or may be user-provided. Additionally, the penalties may be applied uniformly to multiple IP links and/or the penalties may be individualized to each IP link.

After the IP link evaluator 808 and the IP link weighter 810 have evaluated and weighted all the IP links i for the selected traffic element, the path calculator 812 determines a shortest path for the traffic demand in the selected traffic element. The selected traffic element has a source node and a destination node that are used as start and end points between which the traffic demand is routed. To select the path, the example path calculator 812 determines the series of IP links that results in the lowest total weight. If capacity must be added to any one or more of the IP links to support the traffic demand, the path calculator 812 may increase the tentative capacity(ies) $c_i$. In the illustrated example, the tentative capacities $c_i$ may only be increased by available capacity units (e.g., one 40 Gbps wavelength). Thus, if the path calculator 812 adds 5 Gbps of traffic to an IP link i having a tentative capacity $c_i$ of 40 Gbps and traffic $t_i$ of 37 Gbps, where the path calculator 812 may only add 40 Gbps wavelengths to increase capacity, the path calculator 812 will add another 40 Gbps wavelength to increase the tentative capacity $c_i$ to 80 Gbps. The traffic demand of the selected traffic element may then be added to the IP link i.

After the path calculator 812 determines the shortest path, the traffic adder 814 updates the traffic $t_i$ on each of the IP links i selected by the path calculator 812 to handle the selected traffic element. After the traffic adder 814 has updated the traffic $t_i$, control may return to the element selector 806 to select another traffic element from the traffic database 304 or may advance to the traffic updater 816 if all of the traffic elements have been added to the selected network scenario.

The traffic updater 816 examines the IP links i for the selected network scenario. If, for any of the IP links i, the traffic $t_i$ is greater than the upper traffic $T_i$, the traffic updater 816 sets the upper traffic $T_i$ to be equal to the traffic $t_i$ for that IP link i. Control then returns to the scenario selector 802 to select another network scenario for consideration. If all network scenarios have been considered, the network scenario tester 310 may transfer control to the convergence tester 312 of FIG. 3.

The scenario selector 802 of FIG. 8 selects a network scenario (e.g., normal network conditions, single failure condition). FIG. 10 is the table 700 of FIG. 7 after the element selector 806, the IP link evaluator 808, the IP link weighter 810, the path calculator 812, and the traffic adder 814 have added several traffic elements from the traffic database 304 of FIG. 3 to the IP links in the selected network scenario. As illustrated in FIG. 10, the tentative capacities $c_i$ of the IP links A, EXPRESS1, and EXPRESS2 have each been increased by one 40 Gbps wavelength to 80 Gbps.

Suppose the element selector 806 selects the traffic element having a source N2 and a destination N4, with a traffic demand of 23.91 Gbps. The IP link evaluator 808 evaluates each of the IP links i to determine whether each IP link i can support the 23.91 Gbps within its tentative capacity $c_i$ given the current traffic $t_i$ on the IP link i while remaining below an upper utilization constraint (e.g., 0.95). In the illustrated example, the IP links A, D, G, H, and EXPRESS2 can fit the traffic and, thus, the IP link weighter 810 does not apply a penalty. However, the remaining IP links must increase their respective capacities $c_i$ to fit the traffic and/or comply with the upper utilization constraint. Thus, the IP link weighter 810 applies penalties to the IP links B, C, E, F, I, J, K, L, M, N, EXPRESS1, and EXPRESS 2. In the illustrated example, the penalties applied by the weighter 810 are individualized to the IP links i.

Figure 4:
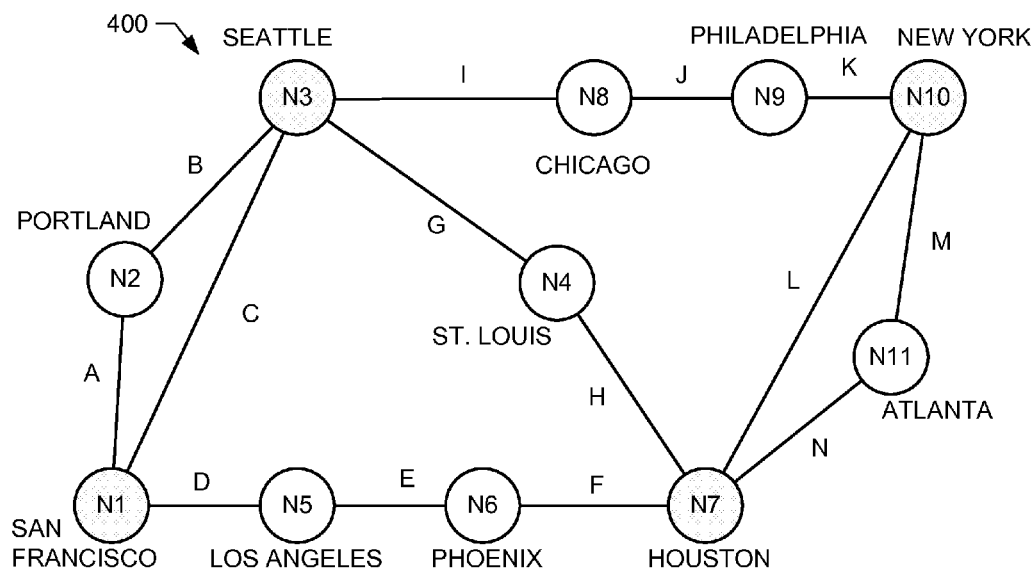
FIG. 4 illustrates a schematic view of an example optical network including example nodes connected via physical links.
Figure 11:
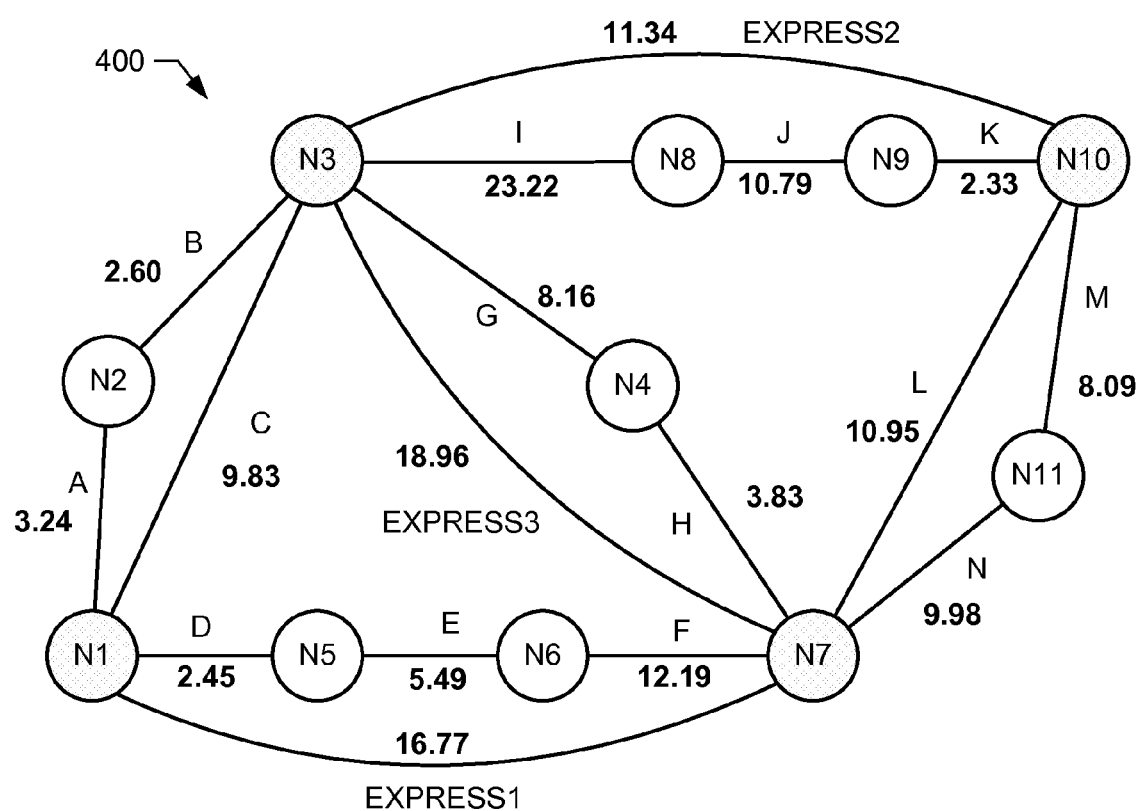
FIG. 11 illustrates the IP links of FIG. 10 associated with the example optical network of FIG. 4 and the corresponding weights, including applied penalties.

FIG. 11 illustrates the IP links of FIG. 10 associated with the example optical network of FIG. 4 and the corresponding weights, including the penalties applied by the IP weighter 812. The path calculator 812 calculates an IP link path for the traffic by adding the weights along the different paths. For example, the path B-G via nodes N2-N3-N4 has a total weight 10.76 and the path A-EXPRESS1-H via nodes N2-N1-N7-N4 has a total weight 23.84. Thus, the path B-G has the lowest weight, and the path calculator 812 adds the traffic from N2 to N4 to the traffic $t_i$ on each of the IP links B and G. As a result, the path calculator 812 must add an additional 40 Gbps wavelength to the IP link B because the traffic will exceed the tentative capacity $c_i$ of the IP link B. The path calculator 812 outputs the selected path to the traffic adder 814, which updates the upper traffic $T_i$ for the IP links B and G and retains the upper traffic $T_i$ for all other IP links i.

In some examples, the network scenario tester 310 may apply one or more latency or delay constraints. The network scenario tester 310 associates with each IP link some amount of latency (i.e., delay). The total latency of a path is the sum of the latencies on the IP links that make up the path. If desired, the network design user may require that, within any given network scenario, the latency on the route that is actually taken by router-to-router traffic must satisfy some constraints. For example, if $D_1$ is the latency of the shortest physical path between a specific pair of routers in that given network scenario, and $D_2$ is the latency of the route actually taken a user may apply constraints on the upper size(s) of $D_2-D_1$ and/or $D_2/D_1$. In the example of FIG. 8, the path calculator 812 may apply the constraints by determining whether the shortest path based on the weights including any penalties (e.g., as applied by the IP link weighter 810) violates a latency constraint, the path calculator 812 causes the IP link weighter 810 to reduce all penalties by half. The path calculator 810 then recomputes the route using the weights with reduced penalties. The path calculator 812 and the IP link weighter 810 may repeat this process until the latency constraint is reduced.

In some other examples, the network scenario tester 310 may consider priority traffic to be different than other traffic. For example, a user of the capacity planner 102 may specify that a subset of the traffic demand in each traffic element of the traffic database 304 of FIG. 3 is "priority" traffic that should take the shortest possible route under any network scenario. Thus, the network scenario tester 310 may evaluate the priority traffic prior to routing or evaluating the remainder of the traffic. For such priority traffic, the IP link weighter 810 does not apply penalties to the normal weights.

While an example manner of implementing the capacity planner 102 of FIG. 1 has been illustrated in FIGS. 3 and 8, one or more of the elements, processes and/or devices illustrated in FIGS. 3 and 8 may be combined, divided, re-arranged, omitted, eliminated and/or implemented in any other way. Further, the example topology database 302, the example traffic database 304, the example IP links database 306, the example topology initializer 308, the example network scenario tester 310, the example convergence tester 312, the example scenario selector 802, the example scenario initializer 804, the example element selector 806, the example IP link evaluator 808, the example IP link weighter 810, the example path calculator 812, the example traffic adder 814, and/or the example traffic updater 816, and/or, more generally, the example capacity planner 102 of FIGS. 1 and/or 3 may be implemented by hardware, software, firmware and/or any combination of hardware, software and/or firmware. Thus, for example, any of the example topology database 302, the example traffic database 304, the example IP links database 306, the example topology initializer 308, the example network scenario tester 310, the example convergence tester 312, the example scenario selector 802, the example scenario initializer 804, the example element selector 806, the example IP link evaluator 808, the example IP link weighter 810, the example path calculator 812, the example traffic adder 814, and/or the example traffic updater 816, and/or, more generally, the example capacity planner 102 could be implemented by one or more circuit(s), programmable processor(s), application specific integrated circuit(s) (ASIC(s)), programmable logic device(s) (PLD(s)) and/or field programmable logic device(s) (FPLD(s)), etc.

When any of the appended apparatus claims are read to cover a purely software and/or firmware implementation, at least one of the example topology database 302, the example traffic database 304, the example IP links database 306, the example topology initializer 308, the example network scenario tester 310, the example convergence tester 312, the example scenario selector 802, the example scenario initializer 804, the example element selector 806, the example IP link evaluator 808, the example IP link weighter 810, the example path calculator 812, the example traffic adder 814, and/or the example traffic updater 816 are hereby expressly defined to include a tangible medium such as a memory, DVD, CD, etc. storing the software and/or firmware. Further still, the example capacity planner 102 of FIG. 3 may include one or more elements, processes and/or devices in addition to, or instead of, those illustrated in FIG. 3, and/or may include more than one of any or all of the illustrated elements, processes and devices.

Figure 12:
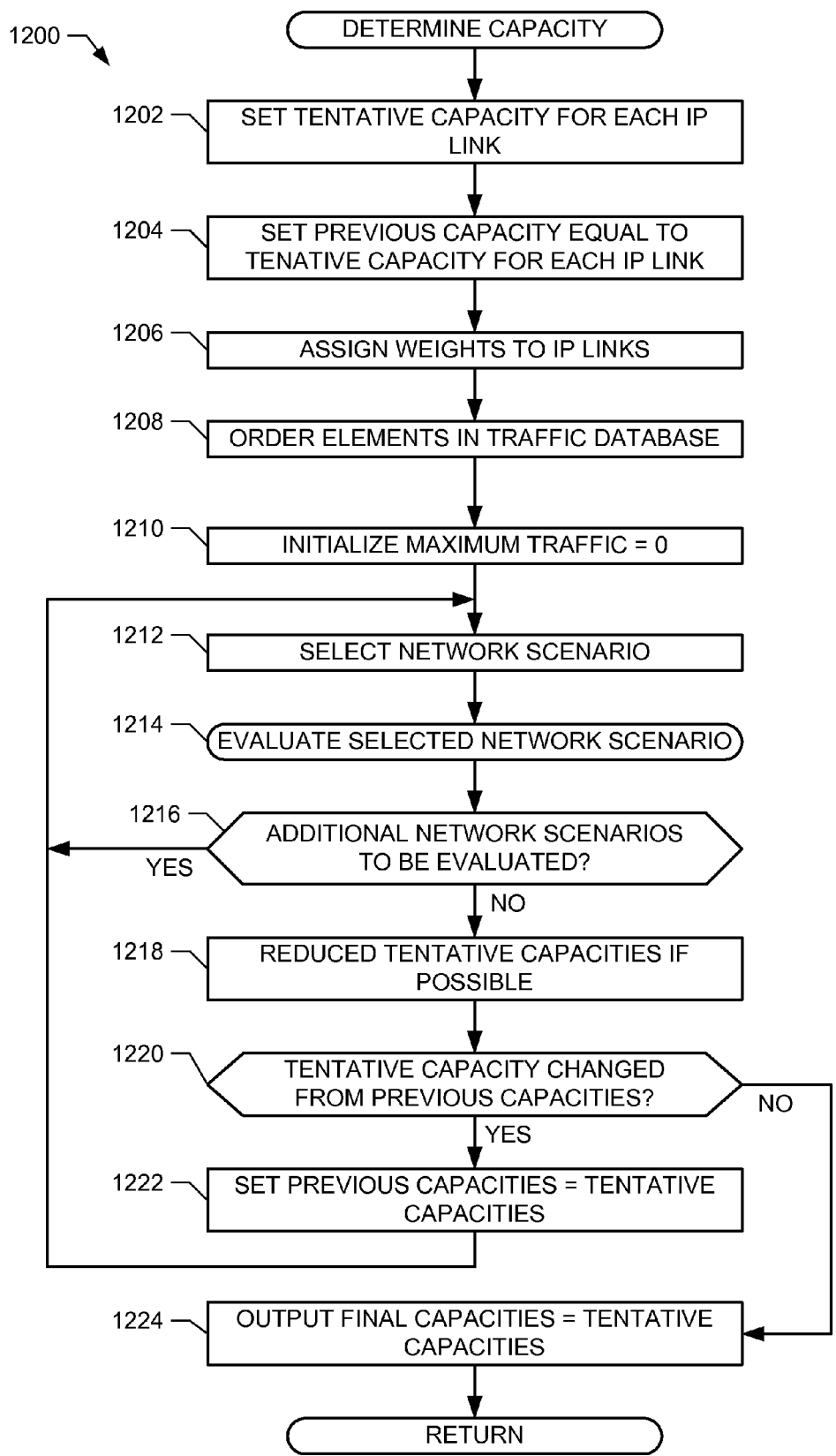
FIG. 12 is a flowchart depicting an example process, which may be implemented using, for example, machine readable instructions that may be executed to determine the IP link capacity to implement an IP link topology.

FIG. 12 is a flowchart depicting an example process, which may be implemented using, for example, machine readable instructions 1200 that may be executed to determine the IP link capacity to implement an IP link topology using Optimized MPLS/TE to route traffic. In contrast to shortest path routing with OSPF, Optimized MPLS/TE considers available IP link capacities when routing. The example instructions 1200 may be executed by, for example, the capacity planner 102 of FIG. 3 to implement the capacity planner 102 FIG. 1. The example capacity planner 102 (e.g., via the topology initializer 308) begins by setting a tentative capacity $c_i$ equal to a lower capacity for each IP link i (block 1202). For example, the topology initializer 308 may set the tentative capacities $c_i$ equal to one 40 Gbps wavelength unit of capacity for each of the IP links i. The topology initializer 308 further sets a previous capacity $c^p_i$ equal to the tentative capacity $c_i$ for each of the IP links i (block 1204). The example topology initializer 308 then assigns weights $w_i$ to each of the IP links i (block 1206). For example, the topology initializer 308 may assign a weight $w_i$ based on the physical distance between the endpoint nodes of the IP link i and a fixed cost of establishing the IP link i. Additionally, the topology initializer 308 arranges the traffic elements in the traffic database 304 in order (block 1208). The arrangement of the traffic elements may be in any convenient order. The topology initializer 308 further initializes an upper traffic $T_i$ variable for each of the IP links i to be zero (block 1210). The upper traffic $T_i$ variable holds the upper amount of traffic that may be encountered by a given IP link i among all considered network scenarios.

The network scenario tester 310 (e.g., via the scenario selector 802) then selects a first network scenario to be considered (block 1212). The network scenarios to be tested may include normal network conditions and any potential failure scenarios against which a network design user may wish to guard the network (e.g., single failure, single/double failure, single/double/triple failure). The network scenario tester 310 evaluates the selected network scenario (block 1214). An example process to implement block 1214 is described below with reference to FIG. 13. By evaluating a network scenario, the network scenario tester 310 determines and updates the upper traffic $T_i$ and the tentative capacities $c_i$ of the IP links i. After evaluating the selected network scenario, the network scenario tester 310 determines whether there are any remaining network scenarios to be tested (block 1216). If there are additional network scenarios to be tested (block 1216), control returns to block 1212 to select the next network scenario.

If there are no additional network scenarios (block 1216), the convergence tester 1508 reduces the tentative capacities $c_i$ where possible (block 1218). For example, the convergence tester 312 may cause the network scenario tester 310 to automatically run blocks 1212-2616 again a second time using the updated tentative capacities $c_i$ (i.e., capacities that are initially at the capacity previously determined by the network scenario tester 310). In the illustrated example, the tentative capacities $c_i$ are reduced, if at all, by whole 40 Gbps wavelength units of capacity while still supporting the respective upper traffic $T_i$ and complying with utilization constraints. After running the network scenario test a second time, the convergence tester 312 determines whether any of the tentative capacities $c_i$ are reduced from the previous capacities $c^p_i$ (block 1218). If any of the example tentative capacities $c_i$ are changed from the previous capacities $c^p_i$ (block 1220), the convergence tester 312 sets the previous capacities $c^p_i$ equal to the tentative capacities $c_i$ for each of the IP links i (block 1222). Control then returns to block 1212 to retest the network scenarios again.

If none of the tentative capacities $c_i$ are reduced (block 1220), the convergence tester 312 sets the tentative capacities $c_i$ as final capacities $c^f_i$ and outputs the final capacities $c^f_i$ to, for example, the cost calculator 314 of FIG. 3 (block 1224).

Figure 13:
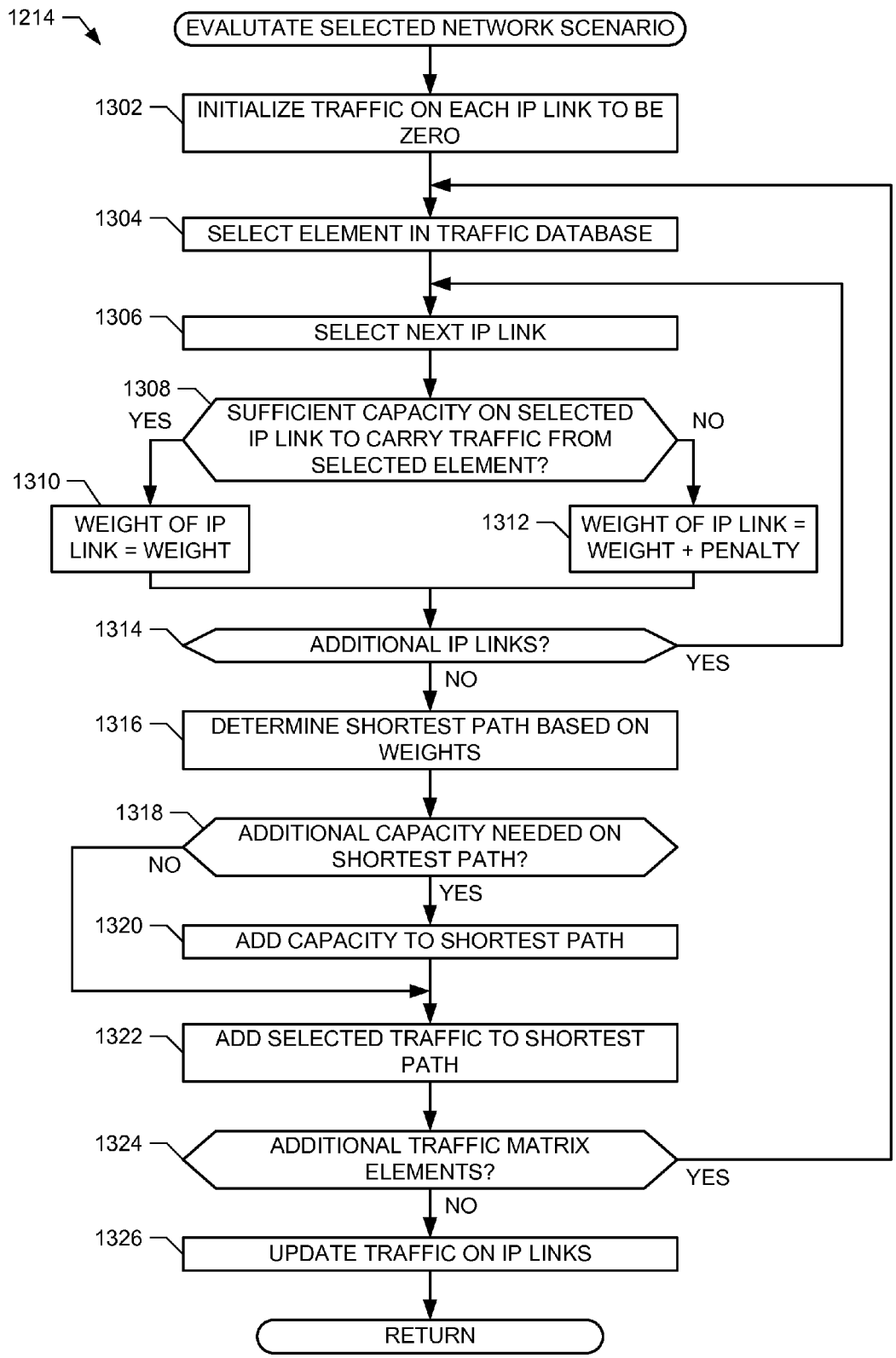
FIG. 13 is a flowchart depicting an example process, which may be implemented using, for example, machine readable instructions that may be executed to determine IP link capacities required for a selected network scenario.

FIG. 13 is a flowchart depicting an example process, which may be implemented using, for example, machine readable instructions 1214 that may be executed to determine IP link capacities $c_i$ required for a selected network scenario. The example instructions 1214 may be executed by the network scenario tester 310 of FIG. 8 to implement block 1214 of FIG. 12. The example network scenario tester 310 (e.g., via the scenario initializer 804) initializes a traffic variable $t_i$ to be zero for each IP link i (block 1302).

The element selector 806 of FIG. 8 selects a traffic element from the traffic database 304 of FIG. 3 (block 1304). In some examples, the element selector 806 selects the traffic element from an ordered list of the traffic elements in the traffic database 304. The IP link evaluator 808 then selects an IP link i from the IP link topology (block 1306). The IP link topology may include, for example, the IP links from the IP links database 306 and the first m potential express links in the chosen express links database 310 of FIG. 3. The IP link evaluator 808 determines whether the selected IP link i has a sufficient capacity $c_i$ to carry the traffic demand from the selected traffic element in addition to the traffic $t_i$ currently assigned to the IP link i (block 1308). The IP link evaluator 808 may further include a requirement that adding the traffic demand from the traffic element to the IP link i complies with any utilization constraints (e.g., $t_i<0.95*c_i$).

If the IP link i has sufficient capacity $c_i$ (block 1308), the IP weighter 810 of FIG. 8 does not change the weight $w_i$ associated with the IP link i (block 1310). In contrast, if the IP link i does not have sufficient capacity $c_i$ (block 1308), the IP weighter 810 applies a penalty to the weight $w_i$ of the IP link i (block 1312). The penalty may be additive or multiplicative. After the IP weighter determines a weight $w_i$ for the IP link i (block 1310 or block 1312), the IP link evaluator 808 determines whether there are any additional IP links i to be considered with the selected traffic element (block 1314). If there are additional IP links i to be considered (block 1314), control returns to block 1306 to select the next IP link i.

If there are no additional IP links i to be considered with respect to the selected traffic element (block 1314), the path calculator 812 determines the shortest path based on the weights $w_i$ of the IP links i (block 1316). The path calculator 812 further determines whether any one or more of the IP links i along the shortest path needs additional capacity to support the traffic demand from the selected traffic element (block 1318). If any of the IP links i needs additional capacity (block 1316), the path calculator 812 increases the tentative capacity(ies) $c_i$ of the IP links i that need the additional capacity (block 1320).

If no additional capacity is needed along the shortest path (block 1318) or after adding needed capacity (block 1320), the traffic adder 814 adds the traffic demand on the selected traffic element to the IP links i on the shortest path (block 1322). The element selector 806 then determines whether there are additional traffic elements to be selected from the traffic database 304 (or the ordered list of traffic elements) (block 1324). If there are additional traffic elements (block 1324), control returns to block 1304 to select the next traffic element from the traffic database 304 (or the ordered list of traffic elements). If there are no more traffic elements (block 1324), the traffic updater 816 updates the traffic $t_i$ on the IP links i (block 1326). For example, the traffic updater 816 may determine whether the traffic $t_i$ is greater than the upper traffic $T_i$ for any of the IP links i and adjust the upper traffic $T_i$ for the IP links i for those IP links i.

Figure 14:
FIG. 14 is a table illustrating results of an example computational comparison of two different capacity planning methods.

FIG. 14 is a table 1400 illustrating an example computational comparison of two different capacity planning methods 1402 and 1404. The traffic database is assumed to be 30% more than the actual traffic observed on an example network in April 2009. The example uses 50 IP backbone nodes and 84 IP links. Between each pair of backbone nodes there are two MPLS/TE tunnels, one carrying regular traffic and the other carrying "priority" traffic. The design is also latency-constrained, with an allowed upper limit for $D_2-D_1$ of 25 ms and an allowed upper limit for $D_2/D_1$ of 3. The table 1400 illustrates the capacity requirements for MPLS/TE routing 1402 using the above-described techniques and OSPF shortest path routing 1404 using PMO or present mode of operation. As illustrated in FIG. 14, the above-described methods result in substantial savings. It is also interesting to note that there is more savings on the inter-office links (i.e., links between nodes in different cities) compared to intra-office links (i.e., links between nodes in the same city) because inter-office links are significantly more expensive than intra-office links. The difference in expense between inter-office and intra-office links was achieved by using a steeper penalty function for inter-office links.

FIG. 15 is a block diagram of an example processing system 1500 that may execute example machine readable instructions to carry out the processes of FIGS. 12 and 13 to implement some or all of the example topology database 302, the example traffic database 304, the example IP links database 306, the example topology initializer 308, the example network scenario tester 310, the example convergence tester 312, the example cost calculator 314, and/or the example topology selector 316, the example scenario selector 802, the example scenario initializer 804, the example element selector 806, the example IP link evaluator 808, the example IP link weighter 810, the example path calculator 812, the example traffic adder 814, and/or the example traffic updater 816, and/or, more generally, the example capacity planner 102 of FIGS. 1, 3, and 8. The processing system 1500 can be, for example, a server, a personal computer, a personal digital assistant (PDA), an Internet appliance, a DVD player, a CD player, a digital video recorder, a personal video recorder, a set top box, a VoIP telephone, an analog telephony adapter, or any other type of computing device.

A processor 1502 is in communication with a main memory including a volatile memory 1504 and a non-volatile memory 1506 via a bus 1508. The volatile memory 1504 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1506 may be implemented by flash memory and/or any other desired type of memory device. Access to the main memory 1504, 1506 is controlled by a memory controller (not shown).

The processing system 1500 also includes an interface circuit 1510. The interface circuit 1510 may be implemented by any type of interface standard, such as an Ethernet interface, a universal serial bus (USB), and/or a third generation input/output (3GIO) interface.

One or more input devices 1512 are connected to the interface circuit 1510. The input device(s) 1512 permit a user to enter data and commands into the processor 1502. The input device(s) can be implemented by, for example, a keyboard, a mouse, a touchscreen, a track-pad, a trackball, isopoint and/or a voice recognition system.

One or more output devices 1514 are also connected to the interface circuit 1510. The output devices 1514 can be implemented, for example, by display devices, such as a liquid crystal display, a cathode ray tube display (CRT), a printer and/or speakers. The interface circuit 1510, thus, typically includes a graphics driver card.

The interface circuit 1510 also includes a communication device such as a modem or network interface card to facilitate exchange of data with external computers via a network 1516, such as an Ethernet connection, a digital subscriber line (DSL), a telephone line, coaxial cable, a cellular telephone system or any other network interface. The network 1516 may be implemented via the communications network 100 of FIG. 1.

The processing system 1500 also includes one or more mass storage devices 1518 for storing software and data. Examples of such mass storage devices 1518 include floppy disk drives, hard drive disks, compact disk drives and digital versatile disk (DVD) drives.

As an alternative to implementing the methods and/or apparatus described herein in a system such as the device of FIG. 15, the methods and/or apparatus described herein may alternatively be embedded in a structure such as processor and/or an ASIC (application specific integrated circuit).

At least some of the above described example methods and/or apparatus are implemented by one or more software and/or firmware programs running on a computer processor. However, dedicated hardware implementations including, but not limited to, application specific integrated circuits, programmable logic arrays and other hardware devices can likewise be constructed to implement some or all of the example methods and/or apparatus described herein, either in whole or in part. Furthermore, alternative software implementations including, but not limited to, distributed processing or component/object distributed processing, parallel processing, or virtual machine processing can also be constructed to implement the example methods and/or apparatus described herein.

It should also be noted that the example software and/or firmware implementations described herein may be stored on a tangible storage medium, such as: a magnetic medium, such as a magnetic disk or tape; a magneto-optical or optical medium such as an optical disk; or a solid state medium such as a memory card or other package that houses one or more read-only (non-volatile) memories, random access memories, or other re-writable (volatile) memories, or successor storage media to any of the above.

Although this patent discloses example systems including software or firmware executed on hardware, it should be noted that such systems are merely illustrative and should not be considered as limiting. For example, it is contemplated that any or all of these hardware and software components could be embodied exclusively in hardware, exclusively in software, exclusively in firmware or in some combination of hardware, firmware and/or software. Accordingly, while the above specification described example systems, methods and articles of manufacture, these examples are not the only way to implement such systems, methods and articles of manufacture. Therefore, although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method to plan a network capacity, comprising:
   receiving a network layer topology comprising a plurality of network layer links;
   applying weights to the network layer links;
   selecting a traffic element of a plurality of traffic elements, the selected traffic element comprising endpoint nodes and a traffic demand;
   determining, using a processor, for at least one of the network layer links, whether the selected traffic element may be routed on a selected network layer link without adding capacity to the selected network layer link;
   applying penalties to the weights associated with the network layer links that cannot support the selected traffic element without adding capacity;
   determining, using the processor, based on the weights and penalties of the network layer links, a routing path comprising at least one of the network layer links between the endpoint nodes;
   adding the selected traffic element to the network layer links on the routing path; and
   determining, using the processor, the capacity of the network layer links based on the selected traffic element.

2. A method as defined in claim 1, further comprising routing the plurality of traffic elements via the plurality of network layer links based on the weights and the penalties.

3. A method as defined in claim 2, further comprising increasing the capacities of the network layer links based on routing the plurality of traffic elements.

4. A method as defined in claim 1, further comprising initializing capacities, upper traffic, and weights for the plurality of network layer links in the network topology.

5. A method as defined in claim 1, further comprising selecting a network scenario corresponding to a normal network condition, a single failure condition, a single/double failure condition, or a single/double/triple failure condition.

6. A method as defined in claim 5, further comprising setting the traffic on the network layer links to an initial value based on selecting the network scenario.

7. A method as defined in claim 5, further comprising determining whether at least one of the capacities may be reduced after testing one or more network scenarios.

8. A method as defined in claim 1, further comprising adding the selected traffic element to upper traffic on the network layer links on the routing path in response to adding the selected traffic to the traffic on the network layer links.

9. A method as defined in claim 1, wherein determining the routing path comprises identifying a path between the endpoint nodes having the lowest sum of weights and penalties of the possible paths between the endpoint nodes.

10. A method as defined in claim 1, further comprising increasing the capacity of the network layer links determined by a path calculator when adding the traffic element to the traffic associated with the network layer link increases the traffic beyond an allowable capacity of the network layer link.

11. A method as defined in claim 10, wherein the allowable capacity comprises the capacity of the network layer link or an upper percentage of utilization of the network layer link capacity.

12. A method as defined in claim 1, wherein the penalty comprises a fixed portion and a portion based on shortest physical routing lengths of the respective network layer links, wherein the penalties are added to the weight of the respective network layer links.

13. An apparatus to plan a network capacity, comprising:
   a link database comprising a plurality of network layer links;
   a topology initializer to apply weights to the plurality of network links;
   an element selector to select a selected traffic element of a plurality of traffic elements comprising a traffic and endpoint nodes;
   a link evaluator coupled to the element selector to determine whether the selected traffic element may be routed on at least one of the network layer links without adding capacity to the at least one network layer link;
   a link weighter coupled to the link evaluator to apply penalties to the weights associated with the network layer links that cannot support the selected traffic element without adding capacity;
   a path calculator coupled to the link weighter to determine, based on the weights and penalties of the network layer links, a routing path comprising network layer links between the endpoint nodes; and
   a traffic adder coupled to the path calculator to add the selected traffic element to the network layer links determined by the path calculator and to determine the capacity of the network layer links on the routing path based on the traffic element.

14. An apparatus as defined in claim 13, wherein the path calculator is to determine the routing path by identifying a path between the endpoint nodes having the lowest sum of weights and penalties of the possible paths between the endpoint nodes.

15. An apparatus as defined in claim 13, wherein the traffic adder is to increase the capacity of the network layer links determined by the path calculator when adding the selected traffic element to the traffic associated with the network layer link increases the traffic beyond an allowable capacity of the network layer link.

16. An apparatus as defined in claim 13, further comprising a traffic updater to update an upper traffic on the network layer links after adding all traffic elements to the network layer links.

17. A tangible computer readable storage medium comprising machine readable instructions which, when executed, cause a machine to perform operations comprising:

applying weights to network layer links in a network layer topology;

selecting a selected traffic element of a plurality of traffic elements, the selected traffic element comprising endpoint nodes and a traffic demand;

determining whether the selected traffic element may be routed on at least one of the network layer links without adding capacity to the at least one network layer link;

applying penalties to the weights associated with the network layer links that cannot support the selected traffic element without adding capacity;

determining, based on the weights and penalties of the network layer links, a routing path comprising one or more of the network layer links between the endpoint nodes;

adding the selected traffic element to the network layer links on the routing path; and determining the capacity of the network layer links based on the selected traffic element.

18. A storage medium as defined in claim 17, wherein the instructions further cause the machine to route the plurality of traffic elements via the network layer links based on the weights and the penalties.

19. A storage medium as defined in claim 18, wherein the instructions further cause the machine to increase the capacities of the network layer links based on routing the plurality of traffic elements.

20. A storage medium as defined in claim 17, wherein the instructions further cause the machine to add the selected traffic element to upper traffic on the network layer links on the routing path in response to adding the selected traffic element to the traffic on the network layer links.

* * * * *